US006583470B1

(12) United States Patent
Maki et al.

(10) Patent No.: US 6,583,470 B1
(45) Date of Patent: Jun. 24, 2003

(54) RADIATION TOLERANT BACK BIASED CMOS VLSI

(75) Inventors: Gary K. Maki, Albuquerque, NM (US); Jody W. Gambles, Albuquerque, NM (US); Kenneth J. Hass, Albuquerque, NM (US)

(73) Assignee: Science & Technology Corporation @ UNM, Albuquerque, NM (US)

( * ) Notice: Subject to any disclaimer, the term of this patent is extended or adjusted under 35 U.S.C. 154(b) by 0 days.

(21) Appl. No.: 09/487,767

(22) Filed: Jan. 19, 2000

Related U.S. Application Data (60) Provisional application No. 60/123,439, filed on Mar. 9, 1999.

(51) Int. Cl.[7] .............................................. H01L 27/01
(52) U.S. Cl. ....................... 257/349; 257/350; 257/372; 257/401; 257/402
(58) Field of Search ................................ 257/349, 350, 257/372, 402, 403, 401, 409

(56) References Cited

U.S. PATENT DOCUMENTS

| | | | |
|---|---|---|---|
| 4,162,480 A | 7/1979 | Berlekamp | 340/146.1 |
| 4,541,067 A | 9/1985 | Whitaker | 364/716 |
| 4,587,627 A | 5/1986 | Omura et al. | 364/754 |
| 4,873,688 A | 10/1989 | Maki et al. | 371/37.1 |
| 5,111,429 A | 5/1992 | Whitaker | 365/156 |
| 5,204,841 A | 4/1993 | Chappell et al. | 365/230.05 |
| 5,406,513 A | 4/1995 | Canaris et al. | 365/181 |
| 5,418,473 A | 5/1995 | Canaris | 326/27 |
| 5,481,555 A | 1/1996 | Wade et al. | 371/57.2 |
| 5,870,332 A | 2/1999 | Lahey et al. | 365/156 |
| 6,005,797 A * | 12/1999 | Porter et al. | 257/370 |
| 6,232,794 B1 * | 5/2001 | Cox | 326/81 |

OTHER PUBLICATIONS

Advanced Hardware Architectures: AHA 4510 High Speed Reed Solomon Encoder/Decoder Data Sheet, 1989.

R. Bose and D. Ray–Chaudhuri, "On a Class of Error Correcting Binary Group Codes," Inf. and Control, 3, pp. 68–79, 1960.
*CCSDS Recommendation for Telemetry Channel Coding*, CCSDS Secretariat, Communications and Data Systems Division, Code–TS, NASA, 1984.
R. Chien, "Cyclic Decoding Procedures for the Bose–Chaudhuri–Hocquenghem Codes," IEEE Trans. Information Theory, IT–10, pp. 357–363, Oct. 1964.
N. Demassieux, F. Jutand, and M. Muller, "A 10Mhz (255, 223) Reed–Solomon Decoder," IEEE 1988 Custom Integrated Circuits Conference, pp. 17.6.1–17.6.4, May 1998.

(List continued on next page.)

*Primary Examiner*—Kevin M. Picardat
(74) *Attorney, Agent, or Firm*—Haverstock & Owens LLP (57) ABSTRACT

A CMOS circuit formed in a semiconductor substrate having improved immunity to total ionizing dose radiation, improved immunity to radiation induced latch up, and improved immunity to a single event upset. The architecture of the present invention can be utilized with the n-well, p-well, or dual-well processes. For example, a preferred embodiment of the present invention is described relative to a p-well process wherein the p-well is formed in an n-type substrate. A network of NMOS transistors is formed in the p-well, and a network of PMOS transistors is formed in the n-type substrate. A contact is electrically coupled to the p-well region and is coupled to first means for independently controlling the voltage in the p-well region. Another contact is electrically coupled to the n-type substrate and is coupled to second means for independently controlling the voltage in the n-type substrate. By controlling the p-well voltage, the effective threshold voltages of the n-channel transistors both drawn and parasitic can be dynamically tuned. Likewise, by controlling the n-type substrate, the effective threshold voltages of the p-channel transistors both drawn and parasitic can also be dynamically tuned. Preferably, by optimizing the threshold voltages of the n-channel and p-channel transistors, the total ionizing dose radiation effect will be neutralized and lower supply voltages can be utilized for the circuit which would result in the circuit requiring less power.

15 Claims, 9 Drawing Sheets

CROSS SECTION

OTHER PUBLICATIONS

G. Feng, "VLSI Architecture for Fast Inversion in $GF(2^m)$," IEEE Trans. on Computers, vol. 38, No. 10, pp. 1383–1386, Oct. 1989.

T. Fujio, "A Study of High–Definition TV System in the Future," IEEE Trans. Broadcast, vol. BC–24, No. 4, pp. 92–100, Dec. 1978.

A. Hillman and G. Alexanderson, *A First Under–Graduate Course in Abstract Algebra*, Wadsworth Publishing, pp. 347–350, 1983.

B.A. Laws, Jr. and C.K. Rushforth, "A Cellular–Array Multiplier for $GF(2^m)$," IEEE Trans. on Computers, Vol. C–20, pp. 1573–1578, Dec. 1971.

G. Meeker, "High Definition and High Frame Rate Compatible N.T.S.C. Broadcast Television System," IEEE Trans. Broadcast, vol. 34, No. 3, pp. 313–322, Sep. 1988.

B. Mortimer, M. Moore, and M. Sablatash, "Performance of a Powerful Error–Correcting and Detecting Coding Scheme for the North American Basis Teletext System (NABTS) for Random Independent Errors: Methods, Equations, Calculations, and Results," IEEE Trans. Broadcast, vol. 36, No. 2, pp. 113–131, Jun. 1990.

I. Reed and G. Solomon, "Polynomial Codes over Certain Finite Fields," J. Soc. Industrial Mathematics, vol. 8, No. 2, pp. 300–304, Jun. 1960.

H. Shao and I. Reed, "On the VLSI Design of a Pipeline Reed–Solomon Decoder Using Systolic Arrays," IEEE Transactions on Computers, vol. 37, No. 10, pp. 1273–1280, Oct. 1988.

Y. Sugiyama, M. Kasahara, S. Hirasawa, and T. Namekawa, "A Method for Solving Key Equation for Decoding Goppa Codes," Inf. Control 27, pp. 87–99, 1975.

C. Wang, T. Truong, H. Shao, L. Deutsch, and J. Omura, "VLSI Archietectures for Computing Multiplications and Inverses in $GF(2^m)$," IEEE Transactions on Computers, vol. C–34, No. 8, pp. 709–717, Aug. 1985.

S. Whitaker, K. Cameron, G. Maki, J. Canaris, and P. Owlsey, "Custom CMOS Reed–Solomon Coder for the Hubble Space Telescope," Proceedings of the IEEE Military Communications Conference, Monterey, CA. pp. 4.3.1–4.3.5, Oct. 1990.

S. Whitaker, J. Canaris, and K. Cameron, "Reed–Solomon VLSI Codec for Advanced Television," IEEE Transactions on Circuits and Systems for Video Technology, pp. 1–21, Jun. 1991.

C. Yeh, I. Reed, T. Truong, "Systolic Multipliers for Finite Fields $GF(2^m)$," IEEE Transactions on Computers, vol. C–33, pp. 357–360, Apr. 1984.

Digital Spectrum Compatible, Technical Description, Zenith Electronic Corporation and AT&T, Feb. 22, 1991.

K. Niwa, T. Araseki, T. Nishitani, "Digital Signal Processing for Video," IEEE Circuits and Devices Magazine, vol. 6, No. 1, pp. 27–32, Jan. 1990.

H. Cha, E. Rudnick, J. Patel, R. Iyer and G. Choi, "A Gate–Level Simulation Environment for Alpha–Particle–Induced Transient Faults," IEEE Transactions on Computers, vol. 45, No. 11, pp. 1248–1256, No. 1996.

J. F. Leavy, L.F. Hoffmann, R.W. Shovan and M.T. Johnson, "Upset Due To A Single Particle Caused Propagated Transient In A Bulk CMOS Microprocessor," IEEE Transactions on Nuclear Science, vol. 38, No. 6, pp. 1493–1499, Dec. 1991.

R. Schneiderwind, D. Krening, S. Buchner, K. Kang and T.R. Weatherford, "Laser Confirmation of SEU Experiments in GaAs MESFET Combinational Logic," IEEE Transactions on Nuclear Science, vol. 39, No. 6, pp. 1665–1670, Dec. 1992.

R. A. Reed, M. A. Carts, P. W. Marshall, C. J. Marshall, S. Buchner, M. La Macchia, B. Mathes and D. McMorrow, "Single Event Upset Cross Sections At Various Data Rates," IEEE Transactions on Nuclear Science, vol. 43, No. 6, pp. 2862–2867, Dec. 1996.

S. Buchner, N. Baze, D. Brown, D. McMorrow and J. Melinger, "Comparison of Error Rates in Combinational and Sequential Logic," IEEE Transactions on Nuclear Science, vol. 44, No. 6, pp. 2209–2216, Dec. 1997.

P.E. Dodd, F.W. Sexton, M.R. Shaneyfelt, B.L. Draper, A.J. Farino and R.S. Flores, "Impact of Technology Trends on SEU in CMOS SRAMs" IEEE Transactions on Nuclear Science, vol. 43. No. 6, pp. 2797–2804, Dec. 1996.

S. Whitaker, J. Camaris and K. Liu, "SEU Hardened Memory Cells For A CCSDS Reed Solomon Encoder," IEEE Transactions on Nuclear Science, vol. 38, No. 6, pp. 1471–1477, Dec. 1991.

M.N. Lui and S. Whitaker, "Low Power SEU Immune CMOS Memory Circuits," IEEE Transactions on Nuclear Science, vol. 39, No. 6, pp. 1679–1684, Dec. 1992.

J. Canaris and S. Whitaker, "Circuit Techniques for the Radiation Environment of Space," IEEE 1995 Customer Integrated Circuits Conference, pp. 77–80, 1995.

J. Gambles and G. Maki, "RAD–Tolerant Flight VLSI From Commercial Foundries," Proceedings of the 39th Midwest Symposium on Circuits and Systems, pp. 1227–1230, Aug. 18–21, 1996.

F.W. Sexton et al., "SEU Simulation and Testing of Resistor–Hardened D–Latches in the SA3300 Microprocessor," IEEE Transactions on Nuclear Science, vol. 38, No. 6, pp. 1521–1528, Dec. 1991.

Y. Savaria, N. Rumin, J. Hayes and V. Agarwal, "Soft–Error Filtering: A Solution in the Reliability Problem of Future VLSI Digital Circuits," Proceeding of the IEEE, vol. 74, No. 5, pp. 669–683, 1986.

M.P. Baze and S.P. Butcher, "Attenuation of Single Event Induced Pulses in CMOS Combination Logic," IEEE Transaction on Nuclear Science, vol. 44, No. 6, pp. 2217–2222, Dec. 1997.

P. Liden, P. Dahlgren, R. Johansson and J. Karlsson, "On Latching Probability of Particle Induced Transients in Combinational Networks," IEEE Computing Society Press, 24th International Symposium on Fault–Tolerant Computer, pp. 340–349, Jun. 15–17, 1994.

K.J. Hass and J.W. Gambles, "Single Event Transients in Deep Submicron CMOS," 42nd Midwest Symposium on Circuits and Systems, Aug. 1999.

K. Joe Hass, Jody Gambles, Bill Walker and Mike Zampaglione, "Mitigating Single Event Upsets From Combinational Logic," 7th NASA Symposium on VLSI Design, pp. 4.1.1–4.1.10, 1998.

S.M. Kang and D. Chu, "CMOS Circuit Design for Prevention of Single Event Upset," International Conference on Computer Design, 1986.

T. Ma and P. Dressendorfer, *Ionizing Radiation Effects in CMOS Devices and Circuits*, Chapter 9, pp. 484–576, 1989.

J. Burr and A. Peterson, "Ultra Low Power CMOS Technology," 3rd NASA Symposium on VLSI Design, 1991.

* cited by examiner

*Fig. 10*   LATCH DESIGN

Fig. 11

RADIATION TOLERANT BACK BIASED CMOS VLSI

RELATED APPLICATIONS

This application claims priority under 35 U.S.C. §119(e) of the co-pending U.S. provisional application Serial No. 60/123,439 filed on Mar. 9, 1999 and entitled "RADIATION TOLERANT BACK BIASED CMOS VLSI." The provisional application Serial No. 60/123,439 filed on Mar. 9, 1999 and entitled "RADIATION TOLERANT BACK BIASED CMOS VLSI" is also hereby incorporated by reference.

GOVERNMENT LICENSE RIGHTS

The U.S. Government has a paid-up license in this invention and the right in limited circumstances to require the patent owner to license to others on reasonable terms as provided for by the terms of Federal Grant No. NAG5-3568 awarded by NASA.

FIELF OF THE INVENTION

This invention relates to integrated circuits. More particularly, this invention relates to a circuit configuration for reducing the impact of total ionizing radiation effects which lead to degradation in performance and overall functionality of CMOS integrated circuits.

BACKGROUND OF THE INVENTION

Figure 1:
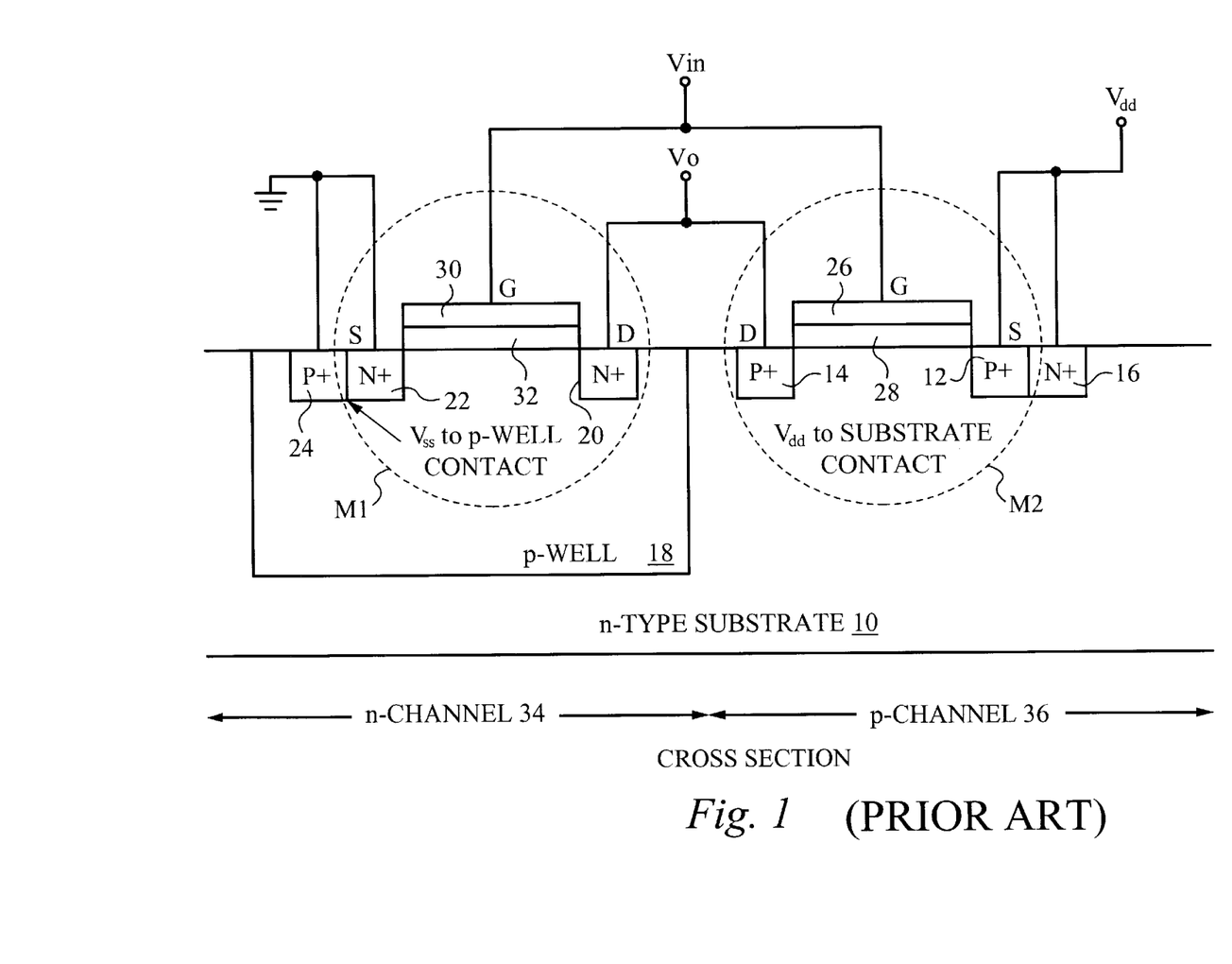
FIG. 1 shows a cross section of a prior art CMOS integrated circuit.

FIG. 1 shows a cross section of a typical CMOS integrated circuit. The circuit shown and described is a p-well circuit. However, it will be apparent to those of ordinary skill in the art that this discussion also applies to n-well circuits by simply interchanging n-type and p-type structures or twin well circuits.

In FIG. 1, an n-type semi-conductor substrate 10, including an n-channel region 34 and a p-channel region 36, is provided for forming the integrated circuit thereon. P-channel devices, such as a p-channel transistor M2, are formed in the n-type substrate 10 by diffusing or implanting a source 12 and a drain 14. In the circuit of FIG. 1, the source 12 of the transistor M2 is coupled to a positive voltage supply Vdd. In typical CMOS circuits, a Vdd to substrate contact is formed of an n+ diffusion 16.

Further, a p-well 18 is formed in the n-type substrate 10. The exemplary integrated circuit illustrated in FIG. 1 also includes an n-channel transistor M1 with a drain 20 and a source 22 formed within the p-well 18 by diffusion or implantation. The source 22 is coupled to ground. A Vss to p-well contact is formed of a p+ diffusion 24 which is also coupled to ground. A p-channel gate 26 of the transistor M2 is formed over a layer of gate insulating oxide 28 in the p-channel region 36 between the source 12 and the drain 14. Similarly, a gate 30 is formed on a layer of gate insulating oxide 32 between the drain 20 and the source 22 of the n-channel transistor M1 in the p-well 18. This circuit is controlled by a voltage Vin applied to the two gates 26 and 30. The p-channel drain 14 is electrically coupled to the n-channel drain 20. The output of this circuit is a signal Vo formed on the two drains 14 and 20.

Figure 2:
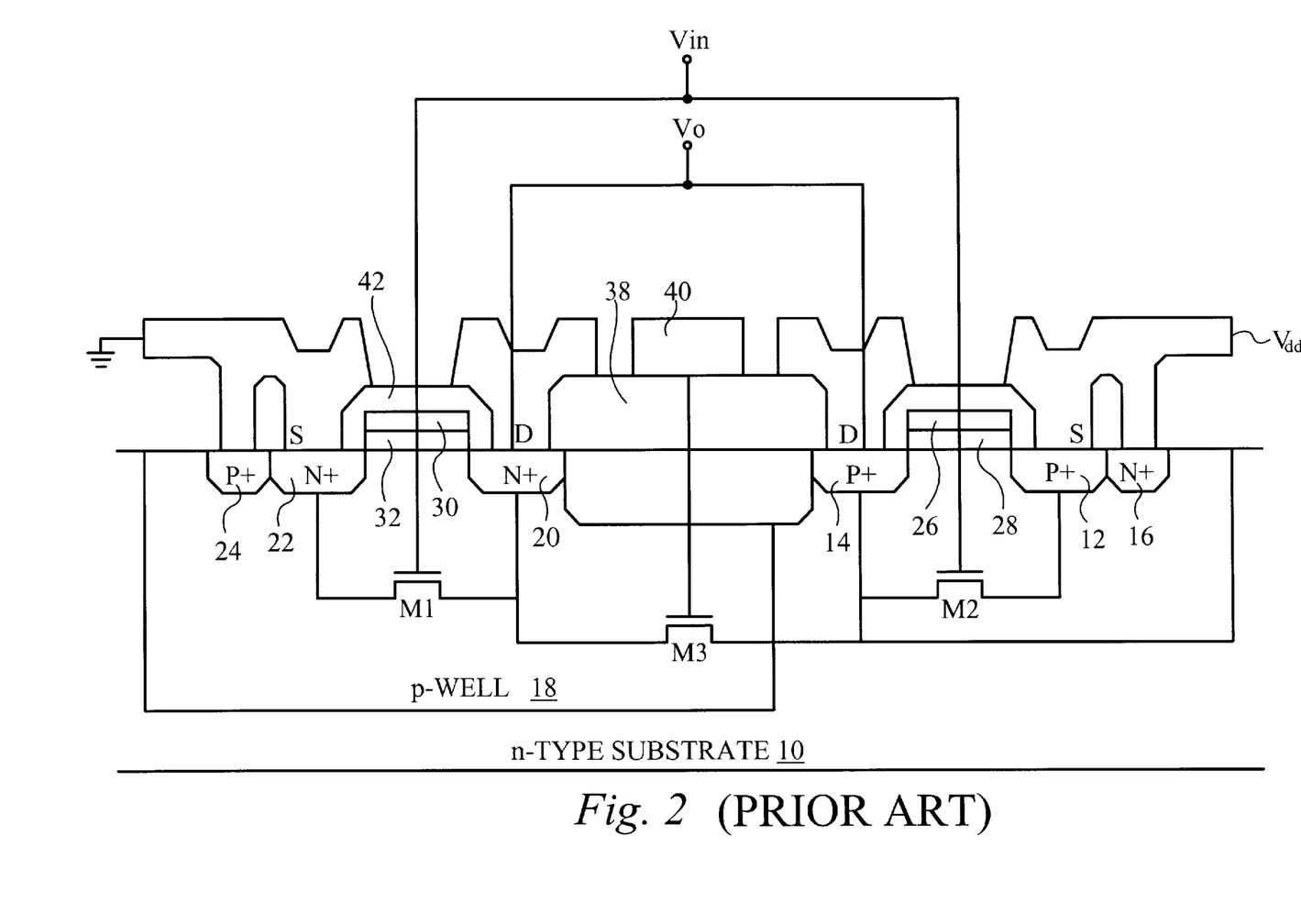
FIG. 2 shows a cross section of a prior art CMOS integrated circuit including a parasitic field transistor.

FIG. 2 illustrates a more detailed cross section of a typical CMOS integrated circuit. The integrated circuit of FIG. 2 includes a parasitic field transistor M3 in addition to the transistors M1 and M2 shown in FIG. 1. The parasitic field transistor M3 shown in FIG. 2 is an n-channel transistor and includes a gate 40 formed on a layer of field insulating oxide 38 between the drain 20 and the n+ diffusion 16.

Ionizing radiation occurs naturally in the form of charged particles that possess enough energy to break atomic bonds and create electron and hole pairs in an absorbing material. These charged particles may include protons, electrons, atomic ions, and photons with energies greater than a bandgap of the absorbing material. When typical integrated circuits, such as the CMOS integrated circuits described above and shown in FIGS. 1 and 2, are exposed to the charged particles over a period of months or even years, the ionizing radiation can contribute to a total ionizing dose. The total ionizing dose can have detrimental long term effects on the typical integrated circuit including circuit performance degradation and functional failure.

For example, as the charged particles pass through MOS devices, such as those shown in FIGS. 1 and 2, they generate electron and hole pairs which can be trapped in the gate oxides 28 and 32 (FIGS. 1 and 2) and the field oxide 38 (FIG. 2). Mobile electrons quickly transport through the field oxide 38 through the gate oxides 28 and 32, however, the holes have a low effective mobility and are easily trapped in the gate oxides 28 and 32 and the field oxide 38. The trapped holes, creating a positive oxide charge, shift threshold voltages of the transistors M1, M2 and M3 in a negative direction. Further, as the charged particles pass through MOS devices, interface states also increase. This increase in the interface states shifts the threshold voltages in the positive direction for n-channel devices, such as the transistor M1 and M3, and in the negative direction for p-channel devices, such as the transistor M2. Generally, the positive oxide charge shift is greater than the interface states shift. As a result, the magnitudes of the threshold voltage of the n-channel transistors M1 and M3 decrease while the magnitude of the threshold voltage of the p-channel transistor M2 increases.

In addition to the positive oxide shift and the interface states shift described above with respect to n-channel and p-channel devices, threshold voltage shifts caused by charged particles further affect parasitic MOS elements, such as the parasitic transistor M3 of FIG. 2. For example, as the threshold voltage of parasitic n-channel transistor M3 decreases, channels begin to form around the drawn n-channel transistor M1 and leakage currents flow around the edges of the n-channel gate region 30. Leakage currents begin to flow from the drain 20 to the source 22. Further, leakage currents also begin to flow from the drain 20 and source regions 22 of the drawn n-channel transistor M1 to the n-type substrate 10 or the n-well through the parasitic field transistor M3. These leakage currents may cause parametric failure to occur before functional failures.

The effects of these charged particles lead to the degradation of performance and ultimate failure of the CMOS devices. The additional radiation-induced interface states degrade the circuit performance by reducing the channel mobility, which as a result decreases channel conductance and transistor gain. Over time, the threshold voltages of the n-channel and p-channel devices may shift to a degree where the n-channel transistors cannot be turned off and the drive capability of the p-channel transistors is not sufficient for the circuit to continue operating at the system clock rate. Such a shift in threshold voltages of either the n-channel or p-channel transistors will cause the circuit to fail.

In addition to the concerns of long term total ionizing dose effects from radiation, there are also concerns of single event effects. Like total ionizing dose effects, single event effects occur because of galactic cosmic rays, solar enhanced particles, and energetic protons and neutrons. However, unlike the total ionizing dose effects, the failure of the circuit due to these single event effects are immediate and do not rely on a cumulative bombardment of charges and the like. Within the scope of single event effects, there are two common categories of single event failures which comprise the following: single event latch up and single event upset.

Figure 3:
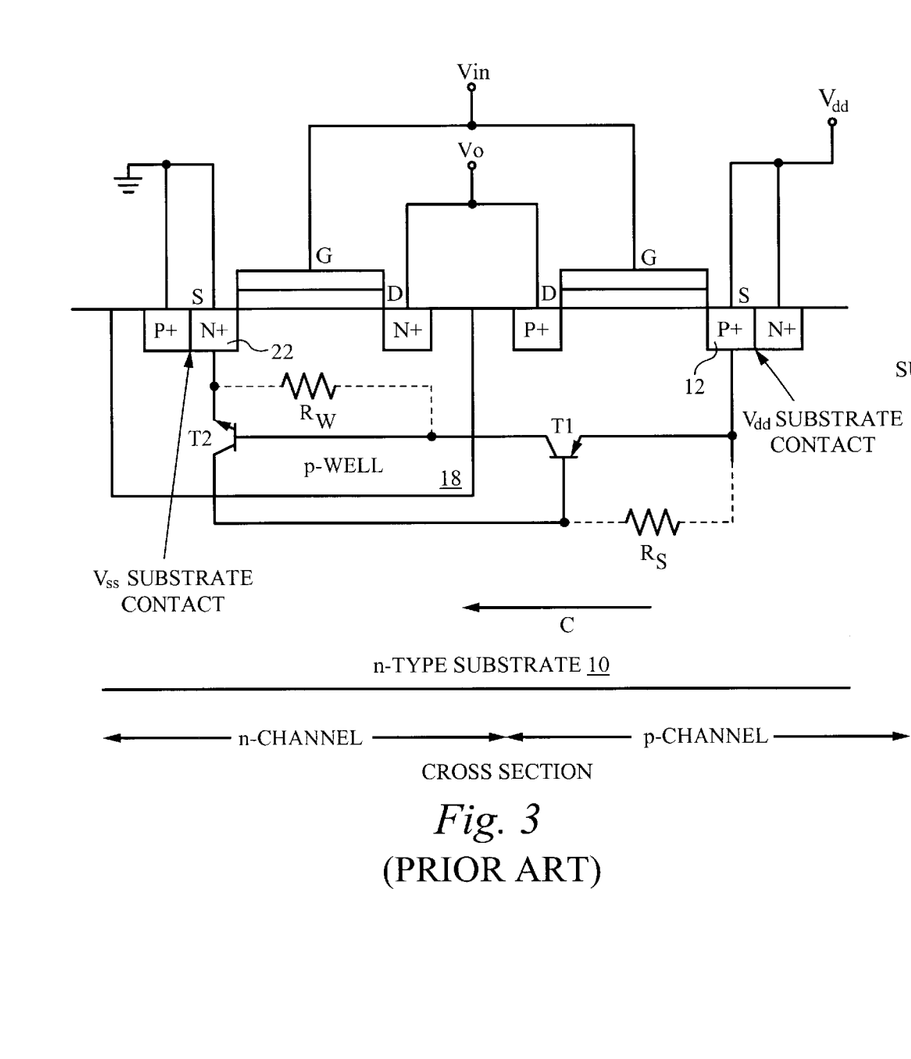
FIG. 3 shows a cross section of the integrated circuit of FIG. 1 including corresponding parasitic devices responsible for a latch up condition.
Figure 4:
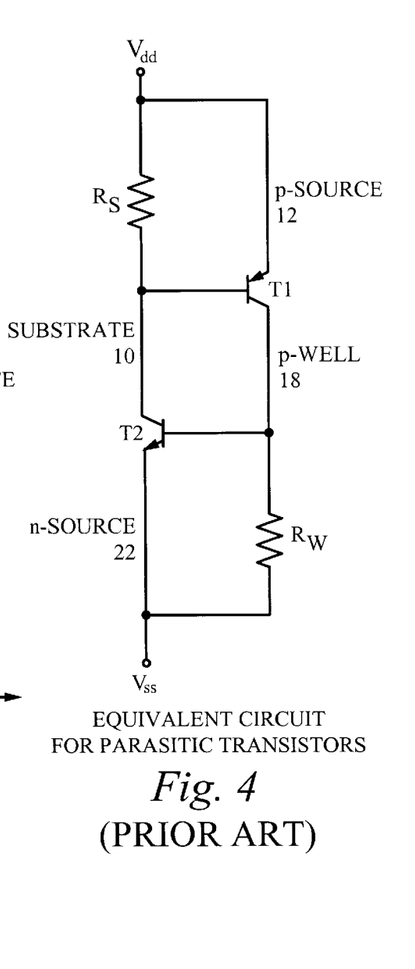
FIG. 4 shows an equivalent circuit of the circuit of FIG. 3 including the parasitic devices.

A first common type of failure is the single event latch up. In CMOS devices containing both n-channel and p-channel devices on a silicon substrate, parasitic bi-polar transistors exist. Latch-up is a well understood and documented phenomenon resulting from parasitic bipolar transistors. FIG. 3 shows the cross section of the integrated circuit of FIG. 1 with a pair of parasitic bipolar transistors T1 and T2 coupled as a Semiconductor Controlled Rectifier (SCR). The transistor T1 is a parasitic pnp transistor. The transistor T2 is a parasitic npn transistor. The emitter of the transistor T1 is formed of the p+ source diffusion 12 of the p-channel transistor. The base of the transistor T1 and the collector of the transistor T2 are formed of the n-type substrate 10. The collector of the transistor T1 and the base of the transistor T2 are formed of the p-well diffusion 18. The emitter of the transistor T2 is formed of the n+ source diffusion 22 of the n-channel transistor. A parasitic impedance $R_s$ is formed in the substrate 10 between the base and the emitter of the parasitic pnp transistor T1. A parasitic impedance $R_w$ is formed in the p-well 18 between the base and emitter of the parasitic npn transistor T2. FIG. 4 shows an equivalent circuit for the parasitic bipolar transistors of FIG. 3.

In the event of a radiation strike into the substrate 10, the radiation induced electron/hole pairs inject current into the base of the pnp transistor T1 causing the transistor to conduct unwanted current and enter the saturation phase of operation. The unwanted current passing through the saturated transistor T1 is driven through the parasitic impedance $R_w$.

The impedance $R_w$ is coupled across the base-emitter junction of the transistor T2. If the value of the impedance $R_w$ times the unwanted current is sufficiently high, the voltage across the impedance $R_w$ can exceed the turn on potential for the transistor T2 causing it to conduct current. If the value of the impedance $R_s$ times the current through the transistor T2 is sufficient to form a voltage large enough to hold the transistor T1 on, then latch-up has occurred. Thus, the transistors T1 and T2 now hold each other in an active and latched condition. This latch-up condition is a self sustaining high current condition which typically causes thermal runaway, which if let unchecked may permanently damage the circuit. Typically, normal operation of the circuit can only be recovered by removing the positive voltage supply Vdd.

The layout for a CMOS circuit which has improved immunity to radiation induced latch up is clearly described in U.S. Pat. No. 5,406,513, issued Apr. 11, 1995, Canaris et al. This referenced patent entitled MECHANISM FOR PREVENTING RADIATION INDUCED LATCH-UP IN CMOS INTEGRATED CIRCUITS is incorporated in its entirety herein by reference.

A second common type of failure in CMOS integrated circuits, the single event upset (SEU) occurs when a data bit or logic state in such a device can be corrupted if exposed to an ionized particle, such as an α particle or heavy ion, and current induced by a particle hit flows from n-type diffusion to a p-type diffusion. Thus, for example, a "1" can be upset in an NMOS static RAM and a "0" can be upset in an PMOS static RAM cell. The improved design of static RAM cells, latch memories, and flip/flop type memories are clearly described in U.S. Pat. No. 5,111,429 issued May 5, 1992, Sterling R. Whitaker. This referenced patent entitled SINGLE EVENT UPSET HARDENING CMOS MEMORY CIRCUIT is incorporated in its entirety herein by reference.

SUMMARY OF THE INVENTION

The present invention is a CMOS circuit formed in a semiconductor substrate having improved immunity to total ionizing dose radiation, improved immunity to radiation induced latch up, and improved immunity to a single event upset. The architecture of the present invention can be utilized with the n-well, p-well, or dual-well processes. For example, a preferred embodiment of the present invention is described relative to a p-well process wherein the p-well is formed in an n-type substrate. A network of NMOS transistors can be formed in the p-well, and a network of PMOS transistors can be formed in the n-type substrate. Preferably, a contact is electrically coupled to the p-well region and is coupled to first means for independently controlling the voltage in the p-well region. Preferably, another contact is electrically coupled to the n-type substrate and is coupled to second means for independently controlling the voltage in the n-type substrate. By controlling the p-well voltage, the effective threshold voltages of the n-channel transistors both drawn and parasitic are preferably dynamically tuned. Likewise, by controlling the n-type substrate, the effective threshold voltages of the p-channel transistors both drawn and parasitic can also be dynamically tuned. Preferably, by optimizing the threshold voltages of the n-channel and p-channel transistors, the total ionizing dose radiation effect will be neutralized and lower supply voltages can be utilized for the circuit which would result in the circuit requiring less power.

Immunity to radiation induced latch up is improved by preferably utilizing a p+ guard ring electrically coupled to a first back bias voltage and formed inside the p-well between the n-channel transistors and the edge of the p-well. Preferably, the p+ guard is continuous and surrounds the n-channel transistors completely. Similarly, an n+ guard ring electrically coupled to a second back bias voltage is formed outside the p-well between the p-channel transistors and the edge of the p-well. Preferably, the n+ guard is also continuous and completely surrounds the p-channel transistors. With the p+ guard and n+ guard configured as described, in the event of a radiation hit, the guard rings operate to preferably reduce the parasitic impedance in the collector circuits of the parasitic bipolars forming a silicon controlled rectifier. Further, the guard rings also preferably act as additional collectors of radiation induced current.

Immunity to radiation induced single event upset is preferably improved by forming duplicate functions in an n-channel network and a p-channel network. The networks are configured such that n-channel control transistors are coupled to control p-channel load transistors and p-channel control transistors are coupled to control n-channel load transistors. This configuration of the transistor networks helps prevent single event upsets from affecting the circuit.

DETAILED DESCRIPTION OF THE INVENTION

Figure 5:
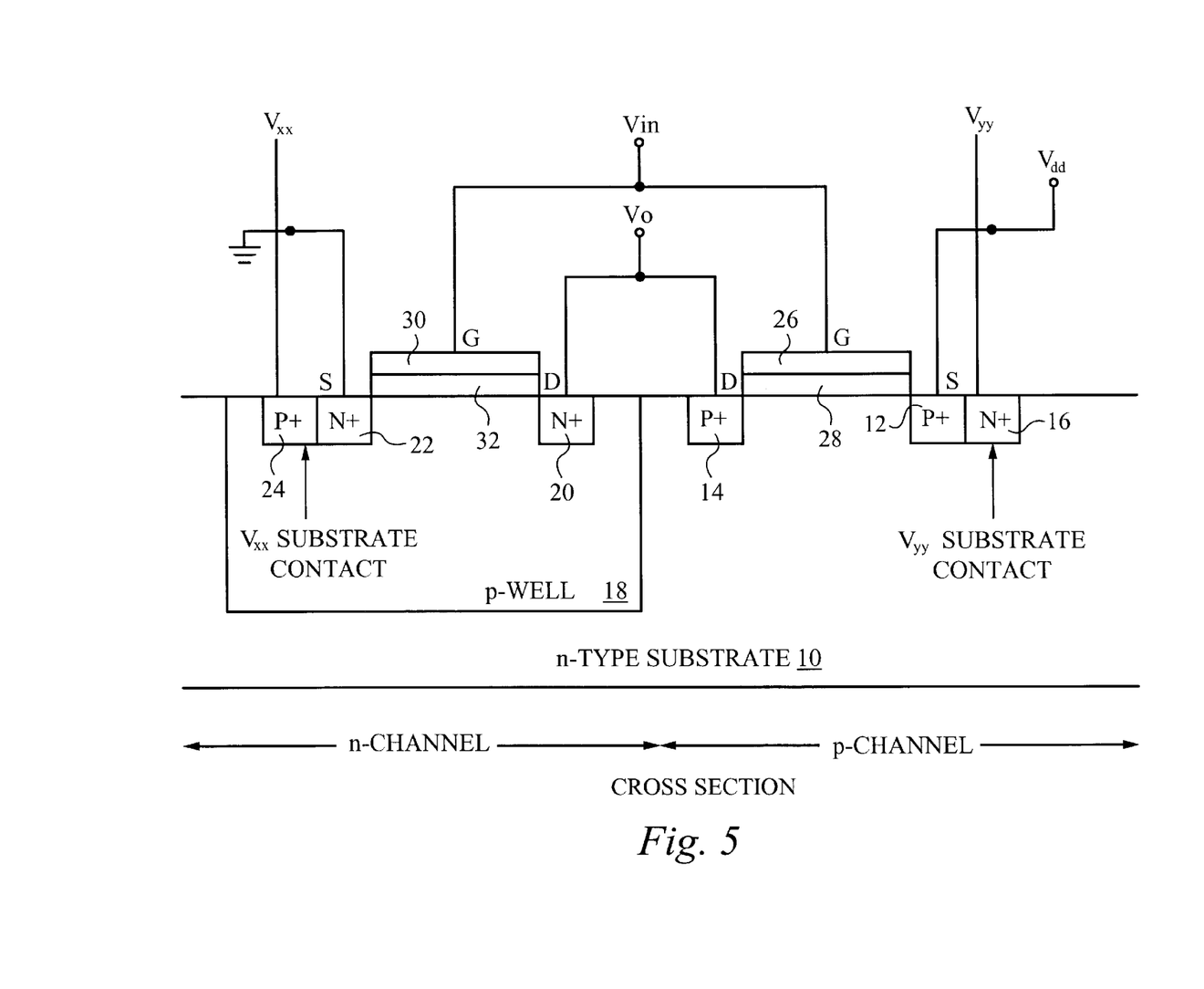
FIG. 5 shows a preferred embodiment of an integrated circuit according to the present invention.

FIG. 5 shows a cross section of a CMOS integrated circuit according to the preferred embodiment of the present invention. For the sake of clarity and simplicity, where appropriate, corresponding elements in the preferred embodiment will be labeled with the same referenced numerals as the prior art shown in FIGS. 1–4. As can be seen, all the structures found in FIGS. 1–4 are found in FIG. 5. However, a key difference between the conventional circuits shown in FIGS. 1–4 and the preferred embodiment shown in FIG. 5 is the configuration of the p+ diffusion 24 which provides a contact to the p-well 18 and the configuration of the n+ diffusion 16 which provides a contact to the n-type substrate 10. Preferably, according the preferred embodiment of the present invention, the p+ diffusion 24 is electrically coupled to an independent voltage source Vxx. Further, the n+ diffusion 16 is preferably electrically coupled to an independent voltage source Vyy. Preferably, as a result, in contrast to the prior art, the p-well 18 is no longer biased to ground, and the n-type substrate is no longer biased to the fixed voltage Vdd.

It is important to note that the voltage sources Vxx and Vyy are independent of each other and can preferably be dynamically adjusted within a range of voltage values. Accordingly, through the p+ diffusion 24 and the n+ diffusion 16, the voltages of the p-well 18 and the n-type substrate can be adjusted according to the voltage sources Vxx and Vyy, respectively.

By individually adjusting the voltage level in the p-well and the n-type substrate in the CMOS process described in the preferred embodiment, the effective voltage thresholds of the NMOS and PMOS transistors, both drawn and parasitic can preferably be adjusted by changing the corresponding voltage level in their respective well or substrate (also referred to as the body.) The following equation (1) shows the relationship between any incremental change in the voltage level of the body (substrate or well) and the change in effective threshold voltage of the corresponding transistor.

$$V_t = V_{t0} + \gamma [\sqrt{2\phi + V_{SB}} - \sqrt{2\phi}] \tag{1}$$

According to the above equation (1), $V_{t0}$ is the effective threshold voltage when the voltage of the body and source of the transistor is the same. Conversely, $V_t$ represents the effective threshold voltage when the voltage of the body and source differ. The symbol, $\gamma$, represents a physical parameter of a transistor and typically has a value of approximately 0.5 volts$^{1/2}$. The symbol, $\phi$, represents a process parameter of a transistor and typically has a value of 0.3 volts.

The preferred embodiment of the present invention can dynamically adjust the effective threshold voltages of the NMOS transistor and the PMOS transistor by biasing the voltages of the p-well 18 and the n-type substrate 10, respectively. This ability to adjust the voltage of the body to compensate for a radiation induced threshold voltage shift is referred to as a means for back-biasing. According to the preferred embodiment, the means for back-biasing preferably controls the voltage of the p-well 18 and the n-type substrate 10 by controlling the bias voltages Vxx and Vyy, respectively.

Figure 6:
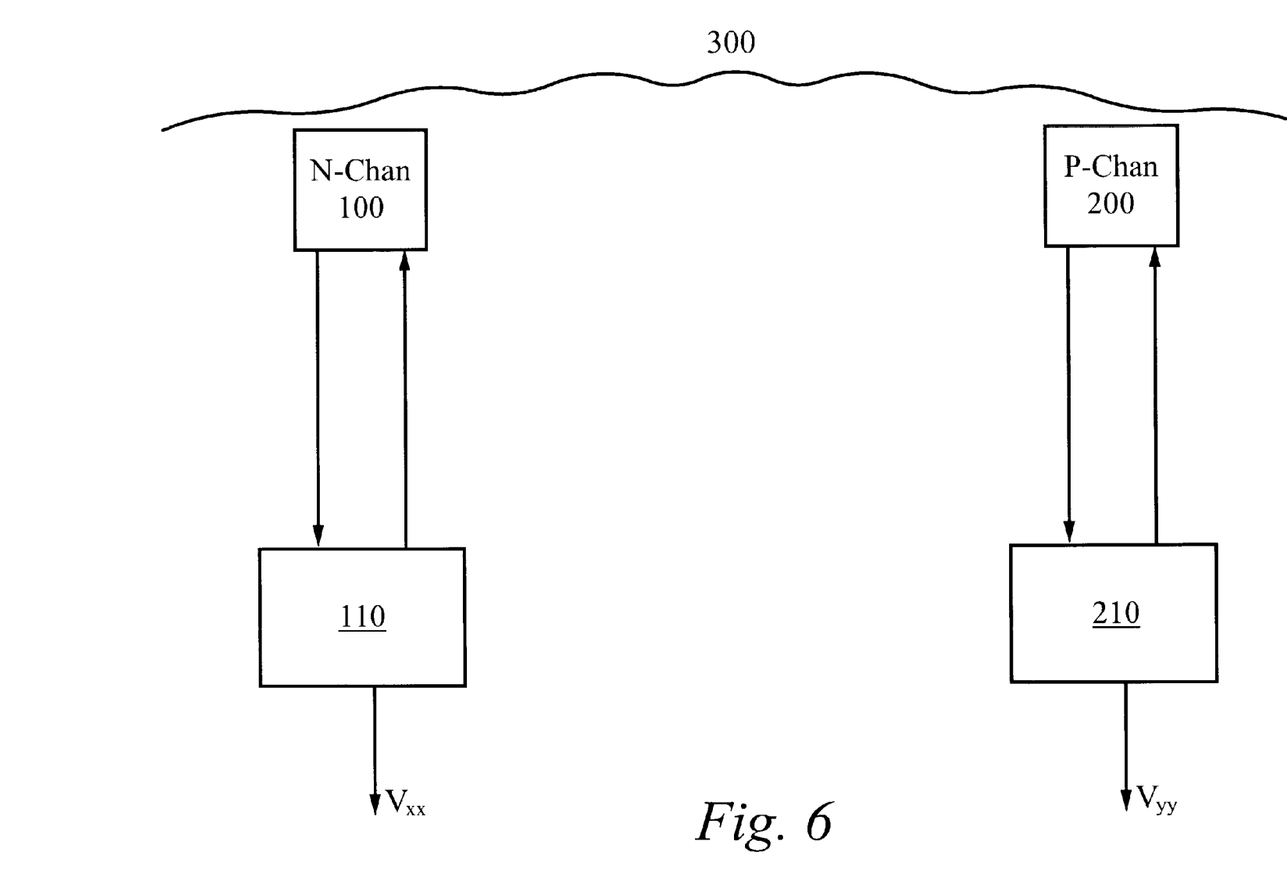
FIG. 6 shows a block diagram of a back-biasing means according to the present invention.

The bias voltages Vxx and Vyy are preferably generated by a dynamic feedback circuit 300 as shown in FIG. 6. This dynamic feedback circuit 300 is designed to independently optimize each of the resulting bias voltages Vxx and Vyy based upon a sampled performance parameter. For example, a sampling n-channel transistor 100 is utilized to sample the shift in threshold voltage for all the n-channel transistors in the p-well 18. The sampling n-channel transistor 100 is cycled through an ON and OFF state to sample and determine the present threshold voltage. The sampling n-channel transistor 100 is preferably coupled to a p-well variable voltage generator 110 which will produce the voltage Vxx and bias the p-well 18 based upon the sampled threshold voltage from the sampling n-channel transistor 100. The connection between the p-well voltage generator 110 and the p-well 18 is shown in FIG. 5 as the p+ diffusion 24.

Similarly, a sampling p-channel transistor 200 can be utilized in the n-type substrate 10 to sample the shift in threshold voltage for all the p-channel transistors in the n-type substrate 10. As in the n-channel sampling transistor 100, the p-channel sampling transistor 200 is also preferably cycled through an ON and OFF state to sample the present threshold voltage. The sampling p-channel transistor 200 is preferably coupled to an n-type substrate variable voltage generator 210. The n-type substrate variable generator 210 produces the voltage Vyy and, as a result also biases the n-type substrate 10 based upon the sampled threshold voltage from the sampling p-channel transistor 200. The connection between the n-type substrate 10 and the n-type variable voltage generator 210 is shown in FIG. 5 as the n+ diffusion 16.

Although the specific circuitry for the p-well variable voltage generator 110 and the n-type substrate variable voltage generator 210 is not shown, it is apparent to a person with ordinary skill in the art that constructing the voltage generators 110 and 210 to create the bias voltages to provide the means for back-biasing can be accomplished without undue experimentation.

Accordingly, the inclusion of this means for back-biasing will allow a variety of combinational logic memory circuits to maintain operational performance over a given range of radiation induced threshold voltage shift. In particular, such combinational logic can include but are not limited to pass transistor circuits, and such memory circuits can include but are not limited to latches and RAM cells.

The radiation induced threshold voltage shift is a cumulative process which is dependent on the total ionizing radiation dose effect. Although back-biasing the body is effective in neutralizing the total ionization radiation dose effect, there is a maximum limit to the amount of total ionizing dose radiation that can be tolerated. This maximum limit is related to the maximum radiation induced threshold voltage shift that can be compensated by the means for back-biasing and the inherent trapped oxide charge collection capabilities of the CMOS fabrication process.

Further, as another important advantage, the back-biasing means limits the parasitic channel leakage currents and also minimizes resulting power consumption of the CMOS circuit. In addition to compensating for the radiation induced threshold voltage shift in the drawn transistors, the means for back-biasing can also compensate for the radiation induced threshold voltage shift in the inherent parasitic transistors found in the CMOS circuit.

It would be apparent to those ordinarily skilled in the art that the complementary CMOS processes to the one disclosed here will be similarly handled. In particular, an n-well can be substituted for the n-type substrate 10 and a p-type substrate can be substituted for the p-well 18. Similarly, in a double well CMOS process, a voltage for the p-well will preferably be controlled by the voltage source Vxx, and a voltage for the n-well will preferably be controlled by the voltage source Vyy.

In addition to CMOS processes, it would also be apparent to those with ordinary skill in the art to apply the means for back-biasing to any combination of n-channel and p-channel devices. For example, the means for back-biasing can be utilized on a circuit only having n-channel devices to counteract the effects of total ionization dose effects. Likewise, the means for back-biasing can also be utilized on a circuit only having p-channel devices to counteract the effects of total ionization dose effects.

Figure 7:
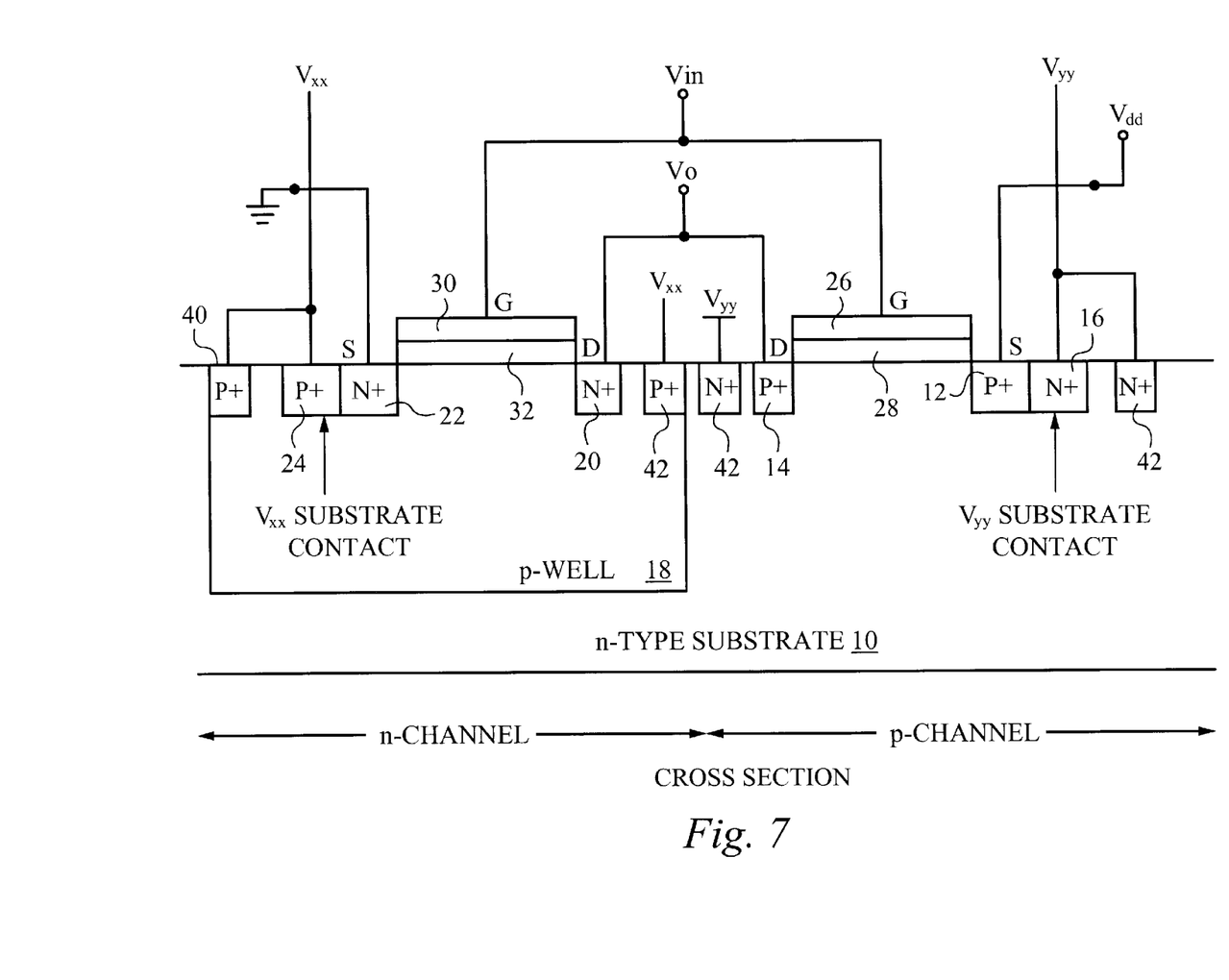
FIG. 7 shows a cross section of a CMOS integrated circuit which implements a p+ guard and an n+ guard according to the present invention.

FIG. 7 shows a cross section of an integrated circuit which implements a p+ guard and n+ guard according to the present invention. Where appropriate, corresponding elements in FIG. 7 will be labeled with the same referenced numerals as the preferred embodiment of FIGS. 5 and 6. Indeed all of the structures of the preferred embodiment of the present invention in FIGS. 5 and 6 are found in FIG. 7. In addition, a p+ guard 40 is tied to Vxx and surrounds the n-channel transistors. An n+ guard 42 is tied to Vyy and surrounds the p-channel transistors.

It is important that the p+ guard is positioned between all n-channel transistors and the edge of their p-well and similarly that the n+ guard is positioned between each p-well and any p-channel devices outside the p-well. Preferably, the entire p-well is ringed with a continuous p+ guard ring and all the non p-well regions are ringed with a continuous n+ guard ring.

It would be apparent to those of ordinary skill in the art that the complimentary CMOS processes to the one disclosed here will be similarly handled. In particular, an n-well CMOS process will incorporate an n+ guard ring surrounding the circuitry formed within the n-well and a p+ guard ring surrounding those regions outside of the n-well. In a double well CMOS technology the n-well will be surrounded by an n+ type guard ring and the p-well will be surrounded by a p+ type guard ring.

The guard rings 40 and 42 can be formed using the source-drain diffuision step in the processing of the integrated circuit. Accordingly, a radiation induced latch-up immune CMOS integrated circuit can be formed using any commercially available CMOS semiconductor process. Under certain circumstances it may be desirable to form a deeper junction for the guard rings 40 and 42. In those circumstances, an additional processing sequence must be added for the p+ guard rings and for the n+ guard rings.

Figure 8:
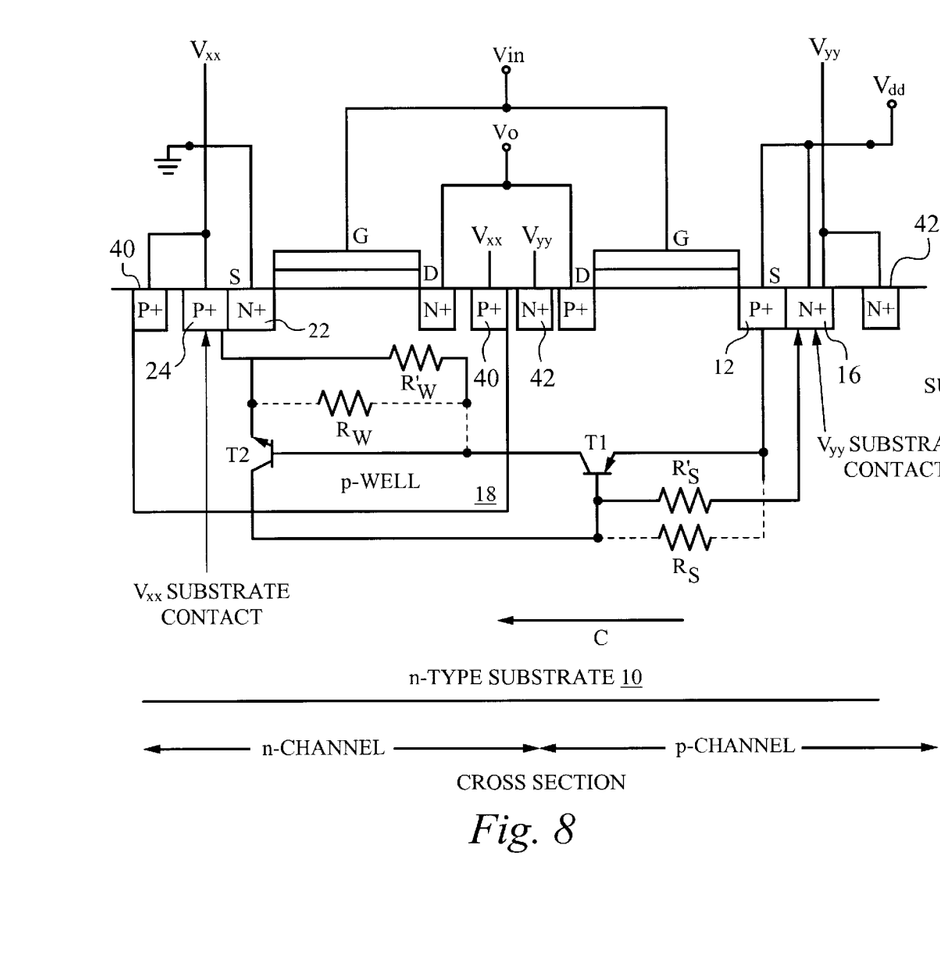
FIG. 8 shows a cross section of the integrated circuit of FIG. 7 including corresponding devices responsible for a latch up condition.
Figure 9:
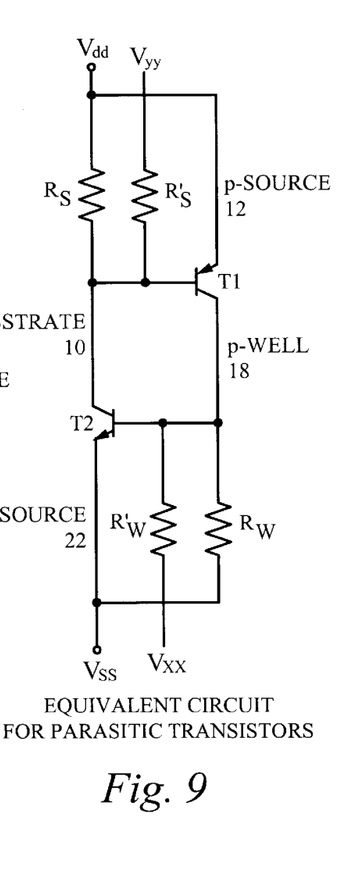
FIG. 9 shows an equivalent.circuit of the circuit of FIG. 8.

FIG. 8 shows the parasitic SCR construction as it relates to the cross section of FIG. 7. FIG. 9 shows the equivalent circuit for the parasitic transistor SCR. Note that the p+ guard ring preferably provides a low impedance resistance in parallel with the resistance $R_w$. Similarly, the n+ guard ring preferably provides a low resistance impedance in parallel with the resistance $R_s$.

As shown in FIG. 9, the guard rings prevent latch-up. The low impedance resistors $R_w'$ and $R_s'$ are formed in parallel to their principal impedances $R_w$ and $R_s$, respectively as shown in FIG. 9. Because the parallel impedance of $R_w$ and $R_w'$ is substantially lower than the impedance of $R_w$, it takes a significantly higher radiation induced current to develop the turn on voltage for the transistor T2. Further, the resistor $R_w'$ acts as an additional collector for the current in the transistor T1. By similar analysis, the parallel resistances of the impedances $R_s$ and $R_s'$ is significantly lower than the impedance found only in the impedance of $R_s$. Accordingly, it will take significantly more radiation induced current through the transistor T2 to develop the turn on voltage for the transistor T1. Further, the impedance $R_s'$ acts as an additional collector to the radiation induced current in the transistor T2. Thus, such a radiation hit only produces a short current burst in the transistor T1 but preferably does not disrupt the operation of the circuit by causing latch-up.

Additionally, similar to the preferred embodiment of the present invention in FIG. 5, the p+ diffusion 24 (in FIGS. 7 and 8) is electrically coupled to an independent variable voltage source Vxx. Further, the n+ diffusion 16 is electrically coupled to an independent variable voltage source Vyy. In contrast to the prior art, the p-well 18 is no longer biased to ground, and the n-type substrate is no longer biased to the fixed voltage Vdd. Preferably, by independently biasing the voltages of the n-type substrate 10 and the p-well 18, the circuit described in FIGS. 7 and 8 has the means for back biasing.

Because of the p+ guard, the n+ guard, and the means for biasing, the circuit as disclosed in FIGS. 7, 8, and 9, has improved immunity against radiation induced latchups and radiation induced effective threshold voltage shifts.

Figure 10:
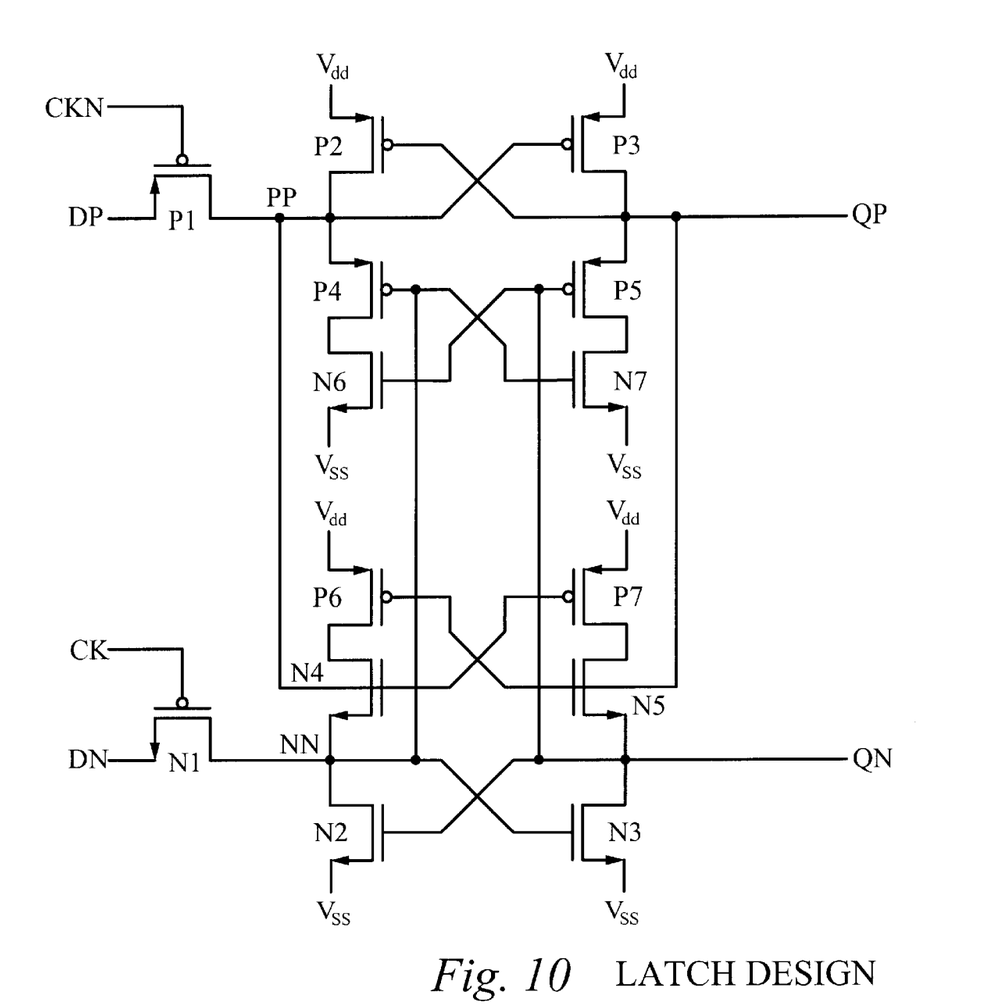
FIG. 10 shows a first circuit which implements a single event upset immunity architecture according to the present invention.

FIG. 10 shows a circuit schematic for a static latch manufactured on a CMOS manufacturing process. Similar to the transistors in FIG. 5, the transistors in FIG. 10 are preferably also protected from long term total ionizing radiation dose effects. The p-type substrate which holds the n-channel transistors is biased by a variable voltage source Vxx. Similarly, the n-type substrate which holds the p-channel transistors is biased by a variable voltage source Vyy. By biasing the p-type substrate and the n-type substrate, the voltage sources Vxx and Vyy provide the means for back-biasing.

Preferably, there are seven n-channel devices and seven p-channel devices making up this flip-flop circuit. An n-channel transistor N1 is configured as a pass transistor coupling a data input DN to the circuit under control of a clock signal CK. A first end of the transistor N1 is coupled to receive the DN signal and a second end of the pass transistor N1 is coupled to the drain of an n-channel transistor N2, a source of an n-channel transistor N4 and to control the gates of an n-channel transistor N3, an n-channel transistor N7, and a p-channel transistor P4.

The drain of the transistor N3 is coupled to the QN output of the latch. The drain of transistor N3 is also coupled to the control gate of the transistor N2, to the source of an n-channel transistor N5, and to control the gates of an n-channel transistor N6 and a p-channel transistor P5. The sources of the transistors N2 and N3 are coupled to the ground supply voltage Vss. The transistors N2 and N3 are cross-coupled for storing the output QN of the latch.

A p-channel transistor P1 is configured as a pass transistor for coupling the p-channel input data DP to the circuit. A first end of the p-channel transistor P1 is coupled to receive the DP signal. The gate of the p-channel transistor P1 is controlled by a complimentary clock signal CKN. A second end of the transistor P1 is coupled to the drain of a p-channel transistor P2, to the gate of a p-channel transistor P3, to a source of a p-channel transistor P4, and to control the gates of the n-channel transistor N4 and a p-channel transistor P7. The drain of the p-channel transistor P3 is coupled to the QP output of the circuit.

The drain of the transistor P3 is also coupled to control the gate of the transistor P2, to a source of a transistor P5, and to control the gates of the n-channel transistor N5 and a p-channel transistor P6. The sources of the transistors P2 and P3 are coupled to the positive supply voltage Vdd. The transistor P2 and P3 are cross-coupled for storing the output QP. A drain of the transistor N4 is coupled to the drain of the transistor P6. Further, the source of the transistor P6 is coupled to the positive supply voltage Vdd. A drain of the transistor N5 is coupled to the drain of the transistor P7. Further, the source of the transistor P7 is coupled to the positive supply voltage Vdd. A drain of the transistor P4 is coupled to the drain of the transistor N6. Further, the source of the transistor N6 is coupled to the ground supply Vss. A drain of the transistor P5 is coupled to the drain of the transistor N7. Further, the source of the transistor N7 is coupled to the ground supply Vss.

As an example of the operation of the circuit shown in FIG. 10 during a single event upset hit, assume that QN=1 and QP=1. In steady state prior to the hit, N1 is off, N2 is on, N3 is off, N4 is off, N5 is on, N6 is on, and N7 is off. Also, P1 is off, P2 is off, P3 is on, P4 is on, P5 is off, P6 is off, and P7 is on.

In the event of a hit by a radiation particle at the output QN of the latch in the n-channel network, current is induced by the hit to flow from the drain of the transistor N3 or the source of the transistor N5 to the p-well which temporarily brings the output QN to a "0". Because the gate of the transistor N2 is controlled by the output QN, N2 preferably shuts off. The drain of the transistor N2 is electrically isolated from ground but floats and thereby remains at "0".

The p-channel transistor P5 is a load device to the storage transistor P3. The gate of the transistor P5 is controlled by the drain of the storage transistor N3 which is also the output QN. As QN goes low due to the single event upset hit, the transistor P5 turns on. However, the n-channel load N7 is operated under control of the drain of the transistor N2 and accordingly, the transistor N7 does not change state and remains off. Thus the storage transistor P3 remains on and the output QP remains at "1". The loads N5 and P7 of the transistor N3 remain under control of the drains of the storage transistors P3 and P2, respectively. Thus, after the single event upset induced current dissipates, the output QN returns to "1". The same analysis may be applied to a single event upset impacting the output QP. Naturally, those of ordinary skill in the art would know to interchange the various polarities and doping types.

Figure 11:
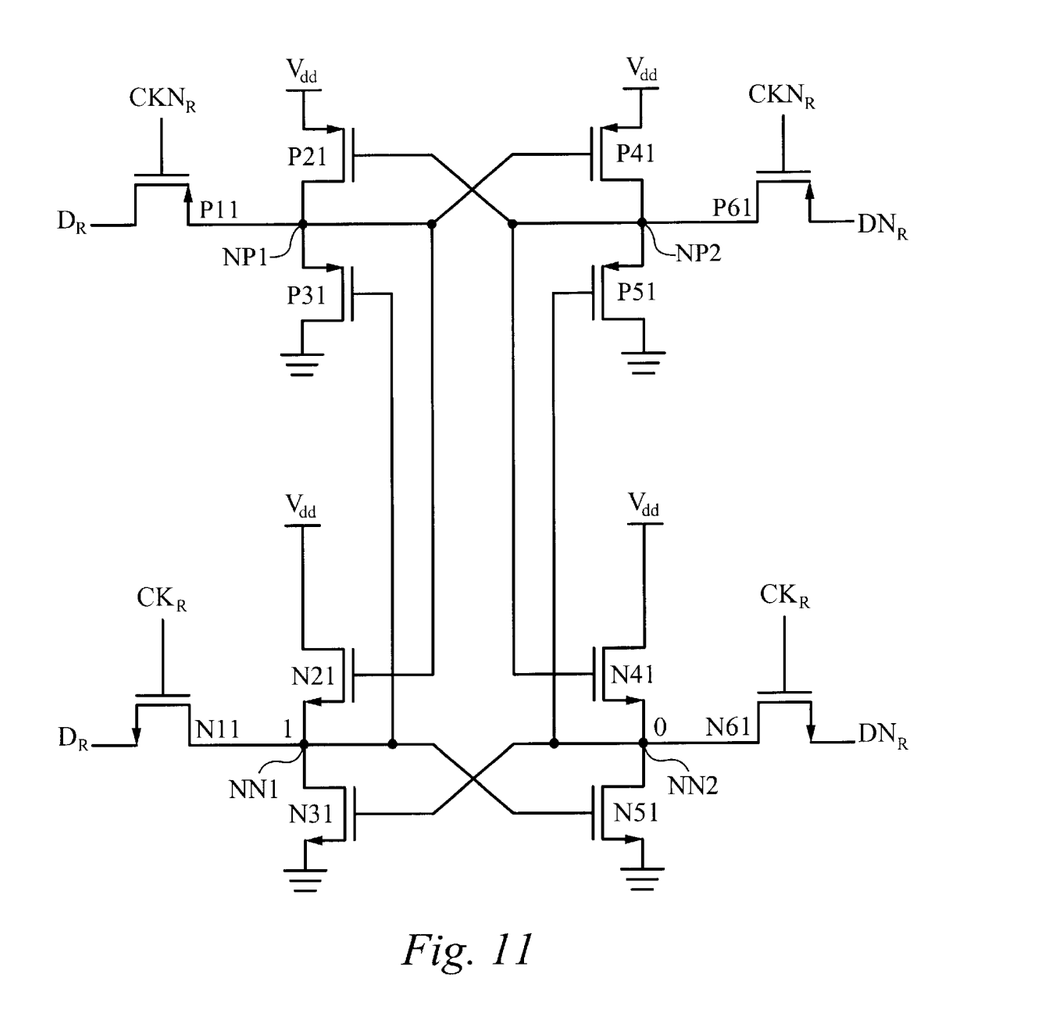
FIG. 11 shows a second circuit which implements a single event upset immunity architecture according to the present invention.

FIG. 11 shows a circuit schematic diagram of a RAM cell of the present invention. The RAM cell of FIG. 11 is hardened against a single event upset. Similar to the transistors in FIG. 5, the transistors in FIG. 11 are preferably also protected from long term total ionizing radiation dose effects. The p-type substrate which holds the n-channel transistors is biased by a variable voltage source Vxx. Similarly, the n-type substrate which holds the p-channel transistors is biased by a variable voltage source Vyy. By biasing the p-type substrate and the n-type substrate, the voltage sources Vxx and Vyy provide the means for back-biasing.

Note that each transistor in the top half of the figure is a p-channel transistor and that each transistor in the bottom half of the figure is an n-channel transistor. This CMOS circuit includes a cross coupled pair of p-channel MOS pass transistors and a cross coupled pair of n-channel MOS pass transistors.

There is a power node Vdd and a ground node Vss. A first end of the channel of a p-channel transistor P11 is coupled to a data line $D_R$ and a second end to a first p-channel data storage node NP1. The gate of the pass transistor P11 is coupled to external control circuitry which is not shown and controlled by the inverse clock signal $CKN_R$.

The source of a p-channel storage transistor P21 is coupled to Vdd. The drain of the transistor P21 is coupled to the second end of the channel of the pass transistor P11, the storage node NP1 and to the source of a p-channel load transistor P31. The drain of the load transistor P31 is coupled to ground Vss.

The source of a p-channel storage transistor P41 is coupled to Vdd. The drain of P41 is coupled to a second p-channel data storage node NP2 and to the source of a p-channel load transistor P51. The drain of the load transistor P51 is coupled to ground Vss. A first end of a p-channel pass transistor P61 is coupled to an inverse data line $DN_R$. The second end of the pass transistor P61 is coupled to a second p-channel storage node NP2. The gate of the pass transistor P61 is controlled by external circuitry which is not shown and is controlled by the inverse clock signal $CKN_R$.

The two p-channel storage transistors P21 and P41 are cross coupled. The gate of the transistor P21 is coupled to and controlled by the drain of the transistor P41. The gate of the transistor P41 is coupled to and controlled by the drain of the transistor P21.

A first end of the channel of an n-channel pass transistor N11 is coupled to the data line $D_R$ and a second end to a first n-channel data storage node NN1. The gate of the pass transistor N11 is coupled to external control circuitry which is not shown and controlled by the clock signal $CK_R$. The drain of an n-channel transistor load transistor N21 is coupled to Vdd. The source of the load transistor N21 is coupled to the second end of the channel of the pass transistor N11, the storage node NN1, and to the drain of an n-channel transistor N31. The source of the transistor N31 is coupled to ground Vss.

The drain of an n-channel load transistor N41 is coupled to Vdd. The source of the load transistor N41 is coupled to a second n-channel data storage node NN2 and to the drain of an n-channel transistor N51. The source of the transistor N51 is coupled to ground Vss. A first end of an n-channel pass transistor N61 is coupled to the inverse data line $DN_R$. The second end of the pass transistor N61 is coupled to a second n-channel storage node NN2. The gate of the pass transistor N61 is controlled by external circuitry which is not shown and is controlled by the clock signal $CK_R$.

The two n-channel storage transistors N31 and N51 are cross coupled. The gate of the transistor N31 is coupled to and controlled by the drain of the transistor N51. The gate of the transistor N51 is coupled to and controlled by the drain of the transistor N31.

The n-channel storage circuit and the p-channel storage circuit redundantly store a binary data bit. The two circuits are cross coupled in that the p-channel load transistors P31 and P51 are coupled to and controlled by the n-channel storage nodes NN1 and NN2 and the n-channel load transistors are coupled to and controlled by the p-channel storage nodes NP1 and NP2. In particular, the gate of the p-channel load transistor P31 is coupled to and controlled by the drain of the n-channel transistor N31. The gate of the p-channel load transistor P51 is coupled to and controlled by the drain of the n-channel transistor N51. The gate of the n-channel transistor N21 is coupled to and controlled by the drain of the p-channel transistor P21. The gate of the n-channel load transistor N41 is coupled to and controlled by the drain of the p-channel transistor P41.

In order to perform the desired function, the n-channel load transistors N21 and N41 are designed to be weak in comparison to the n-channel transistors N31 and N51. Similarly, the p-channel load transistors P31 and P51 are designed to be weak in comparison to the p-channel transistors P21 and P41. The remainder of the transistors are designed to meet normal design considerations for a RAM cell to allow the cell to be written, read, and meet performance criteria.

The RAM cell of FIG. 11 prevents both single event upsets and total ionizing radiation effects. First, the stored bit is stored in two different places, i.e., the cross coupled n-channel storage transistors N31 and N51 and the cross coupled P-channel storage transistors P21 and P41. This redundancy provides and maintains a source of uncorrupted data for the RAM cell after an occurrence of a single event upset. Second, the feedback path between n-channel storage circuit and the p-channel storage circuit cause the lost data to be recovered after a radiation strike.

Finally, use is made of the fact that the current that is induced by the particle strike of a single event upset causes current flow from an n-type diffusion to a p-type diffusion. Thus if either the n-channel storage nodes NN1 or NN2 are storing a "0", that data cannot be lost by the current induced particle hit from the single event upset. Similarly, if either of the p-channel storage nodes NP1 and NP2 are storing a "1" that data cannot be lost by a single event upset.

If the n-channel storage node NN1 is storing a "1" and is hit by a particle, a condition that would cause the loss of data in a non-hardened circuit, the node NN1 is driven to a "0" by the current flow and the n-channel transistor N51 is turned off leaving the second n-channel storage node NN2 at "0". The p-channel load transistor P31 turns on, but because it is designed to be weak in comparison to the storage transistors, it cannot over-drive the p-channel storage NP1. Thus, the n-channel load transistor N21 which is controlled by the p-channel storage node NP1, remains in an on condition thereby restoring the n-channel storage node NN1 to a "1". The same analysis applies to a single event upset impacting a storage node controlled by a p-channel control transistor. One of ordinary skill in the art would know to interchange the various polarities and doping types.

In the memory circuits shown in FIGS. 10 and 11, it is preferable to incorporate the means for back-biasing such that the substrate and well voltages are separately adjustable for the p-channel and n-channel MOS transistors. The benefit of incorporating this means for back-biasing separately compensates for the radiation induced threshold voltage shift for the p-channel and n-channel transistors and allows these circuits to maintain functionality and avoid declining circuit performance and increased power consumption from total ionizing radiation dose.

The inventors have described the preferred embodiment of the present invention in FIGS. 5 and 6 in terms of a circuit to compensate for radiation induced threshold voltage shift from total ionizing dose effects. Further, the inventors have applied to the preferred embodiment two techniques to prevent radiation transient effects. The transient effects include single event upsets in memory and single event latchups in CMOS circuits. To prevent radiation induced single event upsets and total ionizing dose effects, the present invention preferably utilizes redundant storage nodes and the means for back-biasing as shown in FIGS. 10 and 11. As a result, to prevent radiation induced latchups and total ionizing dose effects, the present invention preferably utilizes the p+ guard and n+ guard as well as the means for back-biasing as shown in FIGS. 7, 8, and 9.

Modifications and improvements which become apparent to a person of ordinary skill in the art after reading this disclosure are deemed to be within the spirit and scope of the present invention.

What is claimed is:

1. A CMOS circuit formed in a semiconductor substrate having a circuit bearing surface, the circuit includes a Vdd power supply and a ground, the circuit having improved immunity from effects of total dose radiation and comprising:
   a. a n-channel transistor formed in a p-type region of the substrate having a n-channel source coupled to ground;
   b. a p-channel transistor formed in a n-type region of the substrate having a p-channel source coupled to the Vdd power supply; and
   c. means for back biasing the substrate such that effective threshold voltages of the n-channel and p-channel transistors are separately and dynamically maintained at predetermined levels.

2. The circuit as claimed in claim 1 wherein the circuit includes combinational logic such as a pass transistor circuit.

3. The circuit as claimed in claim 1 wherein the circuit includes memory circuits such as a latch.

4. A CMOS circuit formed in a semiconductor substrate having a circuit bearing surface with a p-type region and an n-type region, the circuit includes a Vdd power supply and a Vss power supply, the circuit having improved immunity from effects of total dose radiation and comprising:
   a. an n-channel transistor formed in the p-type region of the substrate having an n-channel source coupled to the Vss power supply;
   b. a p-channel transistor formed in the n-type region of the substrate having a p-channel source coupled to the Vdd power supply; and
   c. means for separately back-biasing the n-type region with an n-type voltage source and the p-type region with a p-type voltage source such that a first effective threshold voltage of the n-channel transistor and a second effective threshold voltage of the p-channel transistor are separately and dynamically adjusted.

5. The circuit as claimed in claim 4 wherein the CMOS circuit includes combinational logic such as a pass transistor circuit.

6. The circuit as claimed in claim 4 wherein the CMOS circuit includes memory circuits such as a latch.

7. The circuit as claimed in claim 4 wherein the p-type region is a p-type well formed on an n-type substrate.

8. The circuit as claimed in claim 4 wherein the n-type region is an n-type well formed on a p-type substrate.

9. The circuit as claimed in claim 4 wherein the n-type region is an n-type well and the p-type region is a p-type well formed in the substrate.

10. The circuit as claimed in claim 4 wherein the means for separately back-biasing the n-type region and the p-type region limits parasitic channel leakage currents such that performance loss of the circuit is minimized.

11. A CMOS circuit formed in a semiconductor substrate having a circuit bearing surface with a p-type region and an n-type region, the circuit includes a Vdd power supply and a Vss power supply, the circuit having improved immunity from effect of total dose radiation and comprising:

a. an n-channel transistor formed in the p-type region of the substrate having an n-channel source coupled to the Vss power supply;

b. a p-channel transistor formed in the n-type region of the substrate having a p-channel source coupled to the Vdd power supply; and c. means for separately back-biasing the n-type region with an n-type voltage source and the p-type region with a p-type voltage source such that a first effective threshold voltage of the n-channel transistor and a second effective threshold voltage of the p-channel transistor are separately and dynamically adjusted;

the circuit further comprising means for improving immunity to radiation induced latch-up comprising:

d. a single p+ guard formed between the n-channel transistor and the n-type region wherein the p+ guard is electrically coupled to a first back bias voltage Vxx; and e. a single n+ guard formed between the p-channel transistor and the p-type region wherein the n+ guard is electrically coupled to a second back bias voltage Vyy.

12. A CMOS circuit formed in a semiconductor substrate having a circuit bearing surface with a p-type region and an n-type region, the circuit includes a Vdd power supply and a Vss power supply, the circuit having improved immunity from effects of total dose radiation and comprising:

a. an n-channel transistor formed in the p-type region of the substrate having an n-channel source coupled to the Vss power supply;

b. a p-channel transistor formed in the n-type region of the substrate having a p-channel source coupled to the Vdd power supply; and c. means for separately back-biasing the n-type region with an n-type voltage source and the p-type region with a p-type voltage source such that a first effective threshold voltage of the n-channel transistor and a second effective threshold voltage of the p-channel transistor are separately and dynamically adjusted;

the circuit further comprising a cross coupled storage cell for improving immunity from a single event upset comprising:

d. first cross coupled means for storing a bit;

e. second cross coupled means for storing the bit; and f. means for cross coupling the first cross coupled means to the second cross coupled means wherein an occurrence of the single event upset will not disrupt the circuit.

13. The circuit as claimed in claim 12 wherein the first cross coupled means comprises all n-channel transistors and the second cross coupled means comprises all p-channel transistors.

14. A CMOS circuit formed in a semiconductor substrate having a circuit bearing surface with a p-type region and an n-type region, the circuit includes a Vdd power supply and a Vss power supply, the circuit having improved immunity from effects of total dose radiation and comprising:

a. an n-channel transistor formed in the p-type region of the substrate having an n-channel source coupled to the Vss power supply;

b. a p-channel transistor formed in the n-type region of the substrate having a p-channel source coupled to the Vdd power supply; and c. means for separately back-biasing the n-type region with an n-type voltage source and the p-type region with a p-type voltage source such that a first effective threshold voltage of the n-channel transistor and a second effective threshold voltage of the p-channel transistor are separately and dynamically adjusted;

the circuit further comprising means for improving immunity to a single event upset comprising:

d. an n-channel network of devices for performing a function, the n-channel network having a plurality of n-channel control devices and a plurality of n-channel load devices;

e. a p-channel network of devices for performing the function, the p-channel network having a plurality of p-channel control device and a plurality of p-channel load devices; and f. means for cross coupling the n-channel network and the p-channel network such that an n-channel control device controls a p-channel load device and a p-channel control device controls an n-channel load device.

15. A CMOS circuit formed in a semiconductor substrate having a circuit bearing surface with a p-type region and an n-type region, the circuit includes a Vdd power supply and a Vss power supply, the circuit having improved immunity from effects of total dose radiation and comprising:

a. an n-channel transistor formed in the p-type region of the substrate having an n-channel source coupled to the Vss power supply;

b. a p-channel transistor formed in the n-type region of the substrate having a p-channel source coupled to the Vdd power supply; and c. means for separately back-biasing the n-type region with an n-type voltage source and the p-type region with a p-type voltage source such that a first effective threshold voltage of the n-channel transistor and a second effective threshold voltage of the p-channel transistor are separately and dynamically adjusted;

the circuit further comprising means for improving immunity to radiation induced latch-up comprising:

d. a single p+ guard formed between the n-channel transistor and the n-type region wherein the p+ guard is electrically coupled to a first back bias voltage Vxx; and e. a single n+ guard formed between the p-channel transistor and the p-type region wherein the n+ guard is electrically coupled to a second back bias voltage Vyy;

the circuit further comprising a cross coupled storage cell for improving immunity from a single event upset comprising:

f. first cross coupled means for storing a bit;

g. second cross coupled means for storing the bit; and h. means for cross coupling the first cross coupled means to the second cross coupled means wherein an occurrence of the single event upset will not disrupt the circuit;

the circuit further comprising means for further improving immunity from the single event upset comprising:

i. an n-channel network of devices for performing a function, the n-channel network having a plurality of n-channel control devices and a plurality of n-channel load devices;

j. a p-channel network of devices for performing the function, the p-channel network having a plurality of p-channel control device and a plurality of p-channel load devices; and k. means for cross coupling the n-channel network and the p-channel network such that an n-channel control device controls a p-channel load device and a p-channel control device controls an n-channel load device.

* * * * *

UNITED STATES PATENT AND TRADEMARK OFFICE
CERTIFICATE OF CORRECTION

PATENT NO.      : 6,583,470 B1                                        Page 1 of 1
DATED           : June 24, 2003
INVENTOR(S)     : Maki et al.

It is certified that error appears in the above-identified patent and that said Letters Patent is hereby corrected as shown below:

Column 1,
Line 21, replace "FIELF" with -- FIELD --.

Signed and Sealed this

Twelfth Day of August, 2003

JAMES E. ROGAN
*Director of the United States Patent and Trademark Office*